United States Patent [19]

Nagorsen

[11] B 3,999,950
[45] Dec. 28, 1976

[54] APPARATUS FOR CRYSTAL GROWTH IN OUTER SPACE

[75] Inventor: Hans Nagorsen, Berlin, Germany

[73] Assignee: Siemens Aktiengesellschaft, Berlin, Erlangen, Munich, Germany

[22] Filed: Jan. 8, 1974

[21] Appl. No.: 431,785

[44] Published under the second Trial Voluntary Protest Program on February 24, 1976 as document No. B 431,785.

Related U.S. Application Data

[63] Continuation of Ser. No. 214,704, Jan. 3, 1972, abandoned.

[30] Foreign Application Priority Data

Jan. 7, 1971 Germany ............................ 2100540

[52] U.S. Cl. ............................... 23/273 SP; 23/301
[51] Int. Cl.² ..................... B01J 17/00; B01J 17/20
[58] Field of Search ................... 23/273 SP, 301 SP

[56] References Cited

UNITED STATES PATENTS 2,686,864  8/1954  Wroughton et al. ........... 23/301 SP
3,258,314  6/1966  Redmond et al. .............. 23/301 SP Primary Examiner—Norman Yudkoff
Assistant Examiner—Frank Sever
Attorney, Agent, or Firm—Herbert L. Lerner

[57]  ABSTRACT

To obtain semiconductor and other crystals of high crystal quality, a melt which is freely floating in a cosmic vacuum is produced. The melt is then solidified in an oriented state. The melting and pulling processes are carried out by using such a small, natural or artificial celestial body as a reference body, that the gravitational effect of the reference body upon the melt, is much smaller than the terrestrial weight of the melt.

7 Claims, 24 Drawing Figures

Fig.1
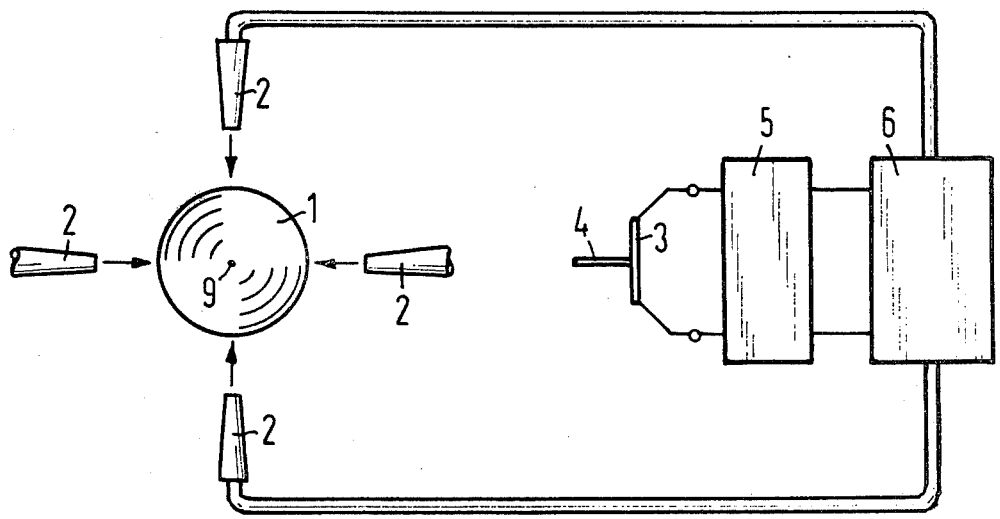
Fig.2
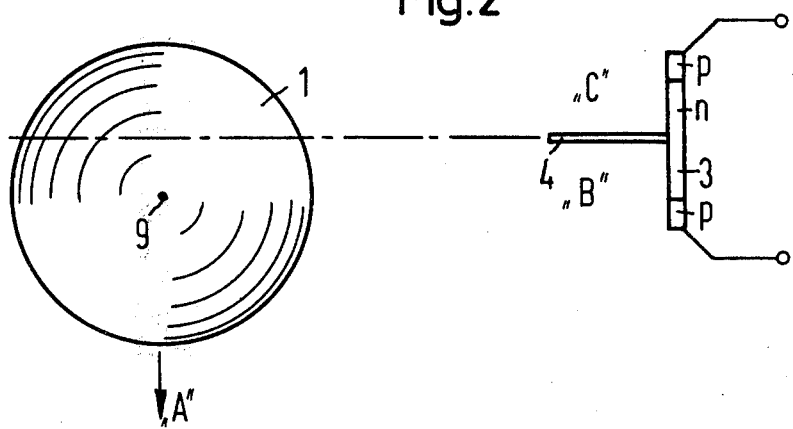
Fig.3 Fig.4
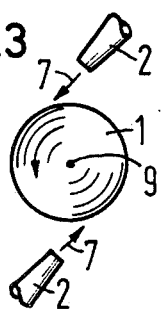 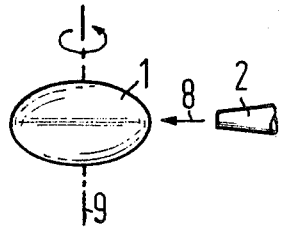

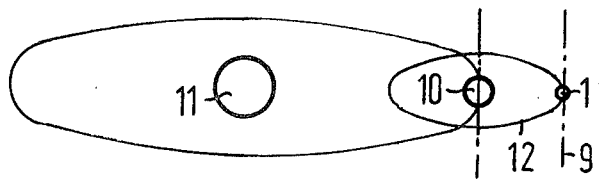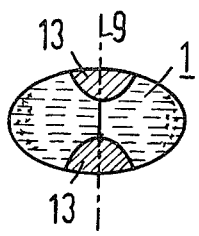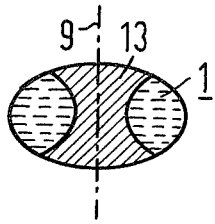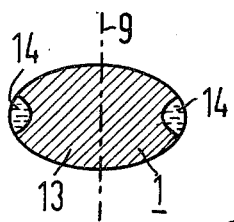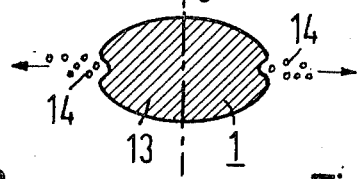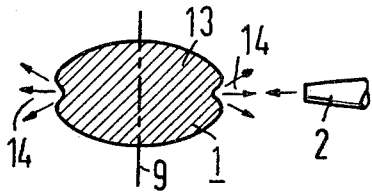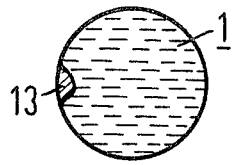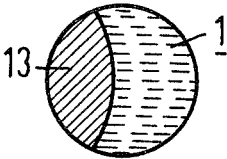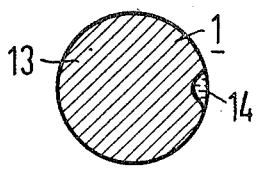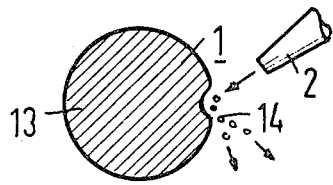

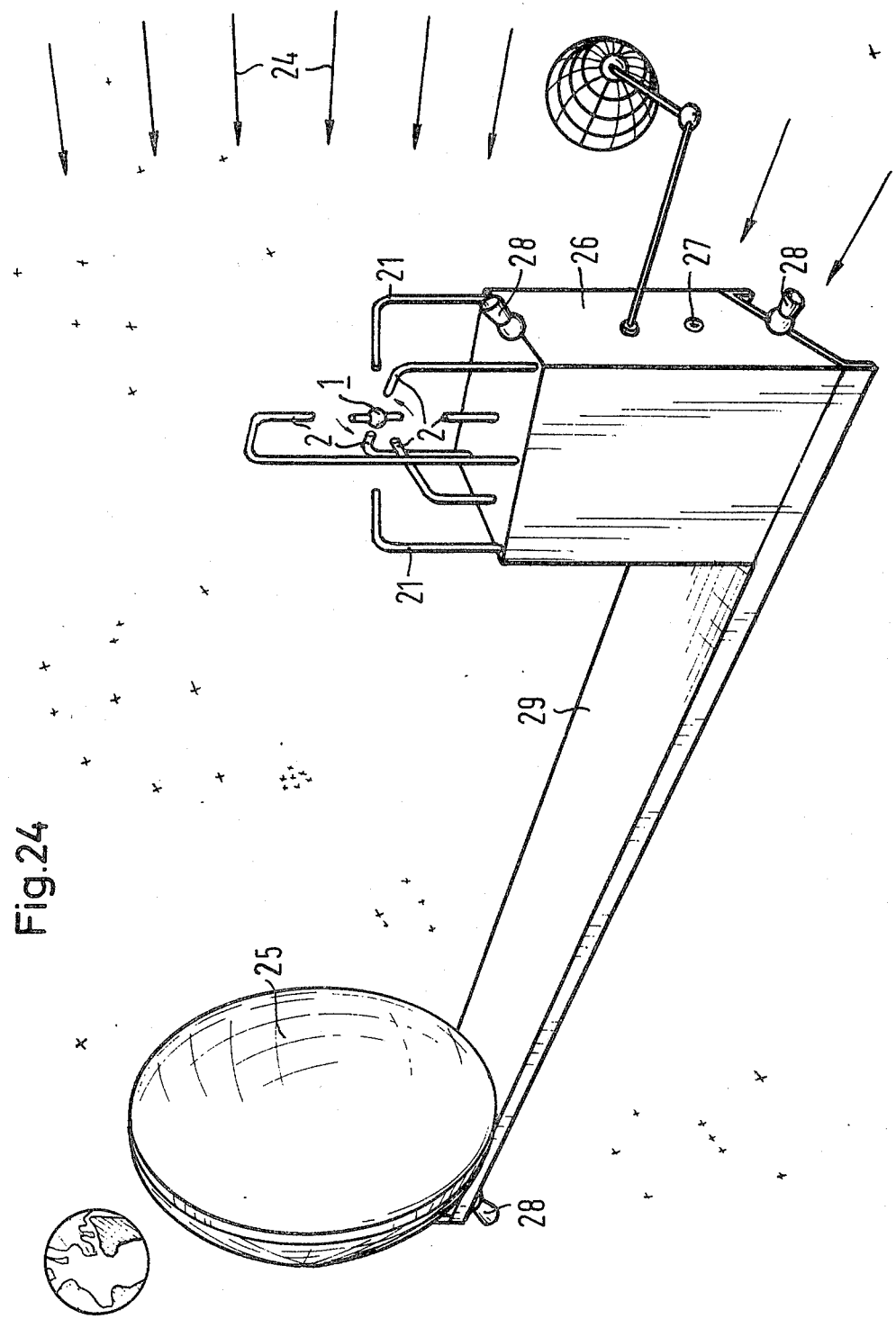

APPARATUS FOR CRYSTAL GROWTH IN OUTER SPACE

This is a continuation of application Ser. No. 214,704, filed Jan. 3, 1972, now abandoned.

The present invention relates to a method of producing crystals, particularly from silicon, by crystallization from a crucible free held melt, particularly a floating melt.

The invention is characterized in that the production of the melt and the crystallization are effected in a cosmic vacuum on such a small, natural or artificial celestial body, that the effect of gravitation of the celestial body upon the melt is much smaller than the terrestrial weight of the melt.

By such a method one is able to obtain crystals which offer the optimum with respect to purity and quality of the crystal structure. The complete absence of an atmosphere in the vicinity of the melt protects the melt against the penetration of any type of undesired impurity from the surroundings, to a degree which is not provided even by the best vacuums, in laboratories on earth. Furthermore, the vaporization of material at the surface of the melt is virtually unhampered by the surroundings, which shifts considerably the ratio of the more volatile impurities to the actual material of the melt, very much in favor of the latter. The suspended state of the melt offers the further important advantage that the melt has no contact with any foreign surface and can, therefore, not become contaminated by such a source. Hence, a condition of ideal crucible-free melting is realized. The absence of a notable weight of the melt and of material being solidified therefrom finally ensures that the material will solidify, to a large degree, without internal tension. This fact benefits the crystal quality of the material.

The requirement of carrying out the method of the invention in a cosmic vacuum, puts an upper limit upon the gravity of the reference body being used, e.g. planetoides and satellites. If the gravity of the reference object or body is too high, as for example on earth, then the vacuum of outer or cosmic space cannot be obtained thereon. While this vacuum is easily attained when the mass of the reference body is sufficiently small, as for example on the moon, which does not permit the retaining of gas molecules, this state is automatically attained.

The amount of crystallizable material which produces the melt, such as silicon for example, either remains suspended under the above-indicated conditions for any desired length of time, or changes its locality very slowly due to the gravitation effect of the reference body. (In a space vehicle—in order to achieve this—care must be taken that the vehicle does not accelerate too much, during the melting process, as this would effect the melt similarly or even more than the terrestrial gravity). Supportive measures may, therefore, be omitted to a great extent. But, after all, should they be needed, they can be obtained with a fraction of the energy that would be required on earth.

The melting process may be effected, e.g. through inductively or capacitatively established alternating fields. Particularly recommended is the use of solar energy. Solar radiation is collected with the assistance of concave reflectors and is concentrated upon the melting stock.

Another preferred embodiment for carrying out the melting process is in the use of electron beams which are produced, e.g. with a so-called "electron gun". The electrons may be emitted directly from the cathode where they are produced, into the vacuum of outer space, where they are focussed by known means such as electric or magnetic lenses and perforated diaphragms, and are oriented toward the melting stock. Since the freely suspended melt must also constantly be supplied with energy, the power effect of these beams must be considered when radiation, particularly particle beams, are employed. This must be taken into account for the reason that the melting stock or resultant melt is suspended completely without friction and, therefore, reacts with appropriate speed to each force effect, i.e. even to very low forces.

Therefore, such beams must be made to act in pairs, arriving from opposite direction toward the melt or the melting stock and the intensity of the beams must be such that the melt will not change its position. If necessary, a weak gravitational effect of the reference body may also be taken into account, so that the vector sum of the forces exerted by both the electron beams and the gravitation field upon the melt is constantly zero, with respect to the central point of the mass.

As long as such beam pairs are oriented exactly upon the central point of the melt mass, the most they can cause is a translation movement of the melt. However, when such beams act in unsymmetrical distribution with respect to the central point of the mass, a torque will also occur. This sets the melting stock or the melt in rotation and this condition is maintained, due to the absence of friction relative to the surrounding. This makes it possible, easily, to achieve high revolution speeds, which may be utilized for removing the impurities.

The nonrotating melt is spherical in the method of the invention and, during rotation, forms an ellipsoid which becomes the more oblate, the faster the melt rotates.

Modern technology requires for some uses increasingly purer semiconductor crystals, whose structure has much fewer disturbances, for example, for the simultaneous transmission of an image, while telephoning. To this end, only especially perfect crystals, for example of silicon, may be used. The required quality could virtually not be attained up to now.

Of the presently available methods, the crucible free zone melting is best suited to produce very pure silicon, possibly with a specific doping. Pure germanium cannot be produced, without difficulty, on earth in this manner, since the liquid zone will drip off because of the higher density (Ge has 5.35 g/cm$^3$, while Si is only 2.33 g/cm$^3$), despite almost equal surface tensions. Crucible free zone melting of germanium would be quite easy on the moon since the specific weight there is below 1 g/cm$^3$. The surface tensions of both materials are, however, not very different.

The conditions are even better for carrying out the crucible free zone melting of substances, to be purified, such as for example, silicon on even smaller celestial bodies than the moon, as for example in a man-made or artificial satellite. For example, on or in a space vehicle which moves freely in space, (such as a satellite moves on an orbit around the earth or around the moon, or possible as a planetoid moves around the sun), a body released without an impulse, will remain suspended in the same place. It may also be provided with an arbitrary rotation. This rotation will continue due to the absence of an outside friction, if the vehicle space is evacuated at this location, by being opened to outer space. The same applies for a sufficiently small, natural, atmosphere free, celestial body.

The molten body which is suspended in a vacuum without contact, such as a silicon ball of any size, is an ideal object for extreme purification and for the production of undisturbed monocrystalls. These are obtained by heating an adequately large freely suspended mass of solid silicon. Suitable heating means are bunched sun rays oriented upon the melting stock, or electron or ion beams, or the beams of a neutral, hot gas. Neutron beams, as well as inductive or capacitative electromagnetic fields, are also suitable.

In order to maintain exactly the sphere's position in space, with respect to the satellite or other reference body and to adjust it, a holding system must be employed, e.g., a system of particle beams whose direction and intensity is controllable. These beams shall, hereinafter, be called "holding or holder beams". An electron radiator may serve as a source for these beams. They may be produced gradually, similarly to being produced in a TV tube and their direction and intensity can then be electrically controlled. The intensity of the used electron beams should be higher as a rule, than that of the electron beam in a TV tube. The holder beams should transmit mechanical pulses to the silicon sphere. It is, therefore, preferable to select electron radiators whose voltages are not too high (100 to 1000 V), since the effective pulses are higher at low voltages at a given energy. On the other hand, ion beams or gas beams may also be used as holding beams which cannot contaminate the melt. For a silicon melt these may be beams of silicon or helium ions or silicon or helium atoms. While the aforementioned radiatiors influence the position of the sphere through pulse transmission (mv; where $n$ = particle mass and $v$ = particle speed), the same goal may be obtained through the influence of a force K, during a specific time t, i.e. a force-time-product (Kt). This offers three possibilities, namely:

1. a purely mechanical pushing with a rod that is wetted as little as possible by the liquid silicon and is not dissolved (for short periods these tasks may be carried out by a gas charged graphite rod);

2. an even purer, with an inhomogeneous HF field, whose use is known as a supporting field for the liquid silicon zone in crucible free zone melting, in laboratories on earth; and 3. by electronic forces.

The position of the melting sphere, relative to the reference body, may also be influenced in quite another manner, especially if the reference body does not comprise much mass. This possibility lies in moving the reference body in correspondence to the position of the melting sphere, for example, by small control nozzles, and adjusting the body to the sphere. In this case, the melting sphere itself is not influenced. Both methods may also be employed together, that is partly the sphere and partly the reference body, may be influenced. In this respect, the economy of the used radiator would be of importance. A regulating and control device, provided for the apparatus which produces the holder beams, monitors the position of the liquid spheres, with the aid of thermally sensitive cells and uses the measured values for controlling the intensity and, if necessary, also the direction of the holder beams.

The invention will be further described with respect to the Drawing, wherein the same part is given the same numeral. In the drawings:

FIG. 1 schematically illustrates the invention;

FIG. 2 shows an enlarged detail of FIG. 1 with the thermocouple cell;

FIG. 3 shows the body set in rotation;

FIG. 4 shows the resulting ellipsoid;

FIGS. 5 and 6 illustrate the theory of reducing precision;

FIGS. 7 to 9 illustrate cooling the body starting from the poles;

FIGS. 10 and 11 illustrate removal of liquid material from the equater;

FIGS. 12 to 15 illustrate the cooling of a non-rotating molten body;

FIG. 24 illustrates utilization of solar energy.

Figure 16:
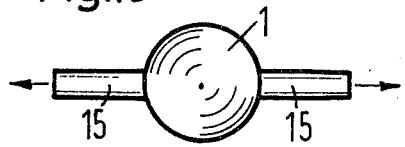
FIGS. 16 to 19 illustrate forming a rod from the melt.

In FIG. 1, each pair of radiators or emitters 2 arranged in three space coordinates perpendicular to one another and oriented against the silicon sphere 1, are situated so that the beams, which the emitter issue and which are controllable with respect to their intensity, oppose each other and are directed to the central point of sphere 1, in its datum position. For sake of clarity, FIG. 1 illustrates only the radiators 2 for two of the coordinates and the control for only one coordinate. The thermal radiation of the silicon sphere 1 is absorbed by a thermocell 3. Each thermocell 3 comprises, for example, two equal thermocouple elements and a diaphragm 4. This diaphragm divides the flow of beams which are issued by the sphere 1, and which impinge upon cell 3, into exactly two equal parts, as long as the sphere remains in its datum position. The diaphragm is defined by a flat screeing plate whose plane is perpendicular to the beam direction of the respective beam, to be controlled. Moreover, the central point of the sphere 1 in datum position, falls into this plane. On both sides of this screening plate one equal element, respectively, of the thermocell 3, is situated. In FIGS. 1 and 2, the thermocouple cell comprises a thin silicon bar with two $p$-$n$ junctions. As shown, schematically, by FIG. 2, the silicon bar is perpendicularly to the diaphragm 4, so that one of the $p$-$n$ junctions is positioned on each side of the diaphragm. The area between the two $p$-$n$ junctions (which are completely equal with regard to doping and dimensions) and each of the regions outside the $p$-$n$ junctions, are provided with an electrical connection, so that the device comprises two parallel connected photo diodes. Now, if the sphere leaves its datum position in the direction of the supervised coordinate, one of the two photo diodes will be charged more strongly than the other, while neither of the two diodes is discriminated against in the datum position. This is used for the control of an amplifier 5 and of a power capacity generator 6 which regulates, in a known manner, the energies that the radiators 2, so that the sphere 1 is driven back into its datum position, due to the altered capacity of the radiators.

In the embodiment of FIGS. 1 and 2, no contacting of the region of the silicon thermocell 3, which is situated between both $p$-$n$ junctions, is provided. Since both $p$-$n$ junctions act during radiation as oppositely poled generators, the direction of the resulting current is determined by that one of the two $p$-$n$ junctions that receives the higher radiation. This behavior can again be utilized for regulating the position of the silicon sphere 1.

Thus, when the silicon sphere 1 abandons its datum position, at least one of the three available thermocells 3 will respond since one of the *p-n* junctions of said cell receives, of necessity, more radiation than the other. If the sphere moves, e.g. in direction A, then because of the diaphragm 4, part B (FIG. 2) is more intensively heated by the radiation of the sphere, than part C. The resulting thermo-current from a specific direction, results in the controlled holder beams via amplifier 5 and power generator 6, shifting the sphere 1, oppositely to the movement of the sphere that is in opposition to direction A. This shifting is stopped as soon as the sphere reassumes its correct position. This applies for each of the three space coordinates. Consequently, the central point of the sphere 1 remains fixed in space, except for minimum rule deviations, with respect to the holding system 2.

Since the thermocouple cell is very much exposed to silicon vapors, it is being protected against these vapors as well as against the silicon precipitations occurring thereon, through the fact that it is installed somewhat in reverse, that is with its back side to the silicon sphere 1. The silicon precipitations are then virtually ineffective. The silicon is known to be rather non-transparent to thermal radiation starting with 1.1 $\mu$ and it is therefore recommended to blacken the surface of the thermocouple cell.

The liquid, suspended silicon sphere 1, undergoes purification, in a known manner, by the preferred evaporation of more volatile impurities. If the liquid sphere 1 is set in rotation through the effect of tangential beams 7 (FIG. 3), whereby at least two oppositely positioned radiators are used so as to avoid translation, the sphere 1 will change into a ellipsoid (FIG. 4). The centrifugal forces then effect an accumulation of heavy impurities in the equator zone of the ellipsoid, at appropriately high rotation speeds. By means of a very strong local radiation, e.g. with electrons 8, these heavy substances (e.g. SiC) may be evaporated preferably at the equator.

The rotating sphere, or the ellipsoid 1 is a rotation-symmetrical gyroscope. While the rotation ellipsoid of the sphere is also a sphere, this no longer applies to the rotation ellipsoid. Mechanical forces with one component being parallel to the axis of rotation, then produce the phenomenon, which is known as regular precision, if said component acts assymetrically with respect to the rotation axis of the liquid ellipsoid. This sets the liquid ellipsoid 1 into a type of tumbler movement which does not fade due to the lack of friction in the surrounding. The precision will thus be a disturbing factor in such instances and one will strive to preclude it.

Consequently, care must be taken that no force acts upon the melt 1 which can lead to a precision movement of the gyroscope. To this end, the action of the massive celestial body, which is closest to the reference body, particularly the sun and the earth, needs to be watched.

When the rotational axis 9 of the rotating silicon sphere 1 and the massive bodies in closest proximity thereto such as the earth 10 and the sun 11, are constantly situated in one plane and if, furthermore, the rotatory axis 9 of the rotating silicon mass 1 is oriented perpendicularly to its orbital plane, around its central body, e.g. parking orbit 12 around the earth 10, the precision releasing power effects are widely eliminated. This arrangement is shown in FIG. 5. In this type of arrangement, the rotation axis of the rotating melt, which is thus formed into an ellipsoid, is so oriented to the gravity forces that affect the melt, that the resultant of these forces is positioned perpendicularly to the axis of rotation. This eliminates the precision. Beneficial conditions with respect to the precision effect upon the rotating silicon melt 1, may also be obtained by orienting the plane of the parking orbit of the rotating silicon mass 1, perpendicularly to the orbit of the earth 10, around the sun 11. This is illustrated in FIG. 6. The device is an example for the fact that the resulting gravitational effect proceeds in parallel to the rotatory axis of the rotating melt 1. There is no precision of the melt in this event, either.

Another important embodiment for purifying the rotating, liquid mass 1, is to cool the rotating mass 1, which was formed as an ellipsoid, starting with the axis of rotation, so that the solidification 13 of the silicon, advances from the poles to the equator (FIGS. 7 to 9). The last liquid remnant 14 on the equator, where all foreign elements are enriched with a distribution coefficient K less than 1, may be separated in various ways from the purified and already solidified material 13, for example, through a sudden strong increase, at this time, in the rotation speed and, thus, also of the centrifugal force, so that the still liquid material 14 is expelled (FIG. 10). Another embodiment provides to blow the liquid material away with the aid of a jet of inert gas and/or to cause the same to evaporate by producing a sudden strong overheating which, however, must be limited only to the contaminated material at the bulge of the equator (FIG. 11). The contaminated region at the equator bulge can, finally, also be previously crystallized and then locally resintered.

The last described variations of the method of the invention are intended for a molten mass, which rotates at high speed and is, therefore, formed into an ellipsoid. If, however, the mass 1 does not rotate, there exists the possibility as indicated in FIGS. 12 to 15, of guiding the solidifying fronts starting from a single location on the sphere surface, successively through the entire, molten mass 1. This is best achieved by slowly throttling the heating of the nonrotating sphere or stopping it altogether. If there is only one thermal source, e.g. the sun, at one's disposal, solidification 13 will start at a point of the surface of the molten sphere, that is turned away from the heating source. This point lies exactly opposite the heating source. Here, too, the liquid residue 14, which is provided with the accumulated impurities will be removed, for example, by being blown away with a hot inert gas (FIG. 15). In accordance with the conventional zone pulling, this process may be repeated several times at the same sphere.

Figure 17:
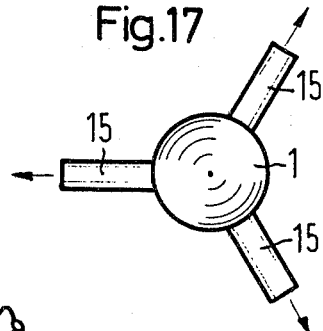

If one wishes to pull a rod shaped monocrystal from the fusible silicon sphere, 1, a force will occur during the pulling, due to the pulse preservation principle, for example for a rod of 5 cm diameter, a force of about 10 p which will effect, based on the conditions of the method of the invention, a notable shift of the melt from its datum position. For example, a silicon sphere of 10 cm diameter will experience an acceleration of about 10 cm/sec.$^2$; thus after 1 second, it will have reached a speed of 10 cm/sec., that is a shift of 5 cm. Several possibilities are available for compensating this effect. For example, one monocrystal 15, each, may be pulled simultaneously in opposite directions, for the sphere 1. By making sure that both monocrystals are of equal thickness and are crystallized at the same speed, the forces, which were exerted upon the melt by the pulling process, are cancelled. The same effect may be obtained by pulling three or several crystals, simultaneously, from the freely suspended melt 1 (FIG. 17). The pulling speed, as well as the pulling direction must be adjusted so that the resultant pulse upon the melt, will disappear.

Figure 18:
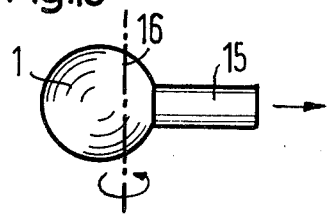

In order to pull the crystal or the crystals, during the pulling process, from the melt which is either freely suspended or fixed in its position by holder beams, a pulling force may be used against the crystal 15, with the aid of a mechanical device, which resembles the Czochralski method. The pulling may be done by a centrifugal force by letting the crystal 15 rotate with the melt 1, around a rotatory axis 16 which is laid through the melt and is in eccentric relation to the crystal. This is illustrated in FIG. 18. The rotation axis 16 of FIG. 18 does not extend through the mass' central point of the melt 1, but is situated between that point and the crystal 15, to be pulled. This arrangement of the axis of rotation 16 also provides a centrifugal force at the mass' central point of the melt 1, and is opposed to the translatory action against the melt, as a result of the pulling process. Under certain circumstances, this can lead to a better distribution of all the forces which act upon the melt, so that the holder beams may be dispensed with. To this end, the system sphere (10 cm diameter) and monocrystalline rod (5 cm diameter and 10 cm length) must rotate with approximately 0.3 revolutions per second, i.e. around an axis which lies at an approximate distance of 2.75 cm from the central point of the sphere.

Figure 19:
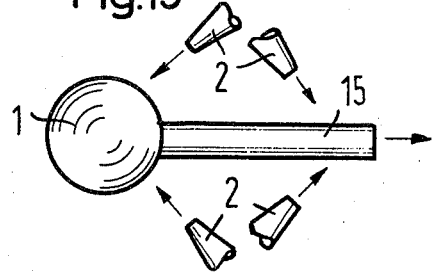

Another possibility to produce or compensate the pulling force that moves the crystal, is to position in the junction axis of sphere 1 and crystal 15, diagonally oriented particle radiators 2, which exert oppositely oriented pulses, so that a resulting force will try to separate the two (FIG. 19) upon the crystal 15 and the sphere 1.

Figure 20:
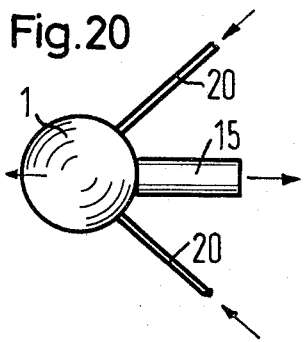
FIGS. 20 and 21 illustrate the replacing of the consumed material of the melt when pulling a rod.
Figure 21:
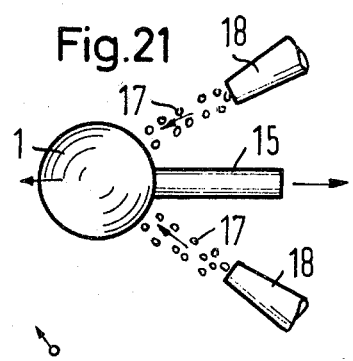
Figure 23:
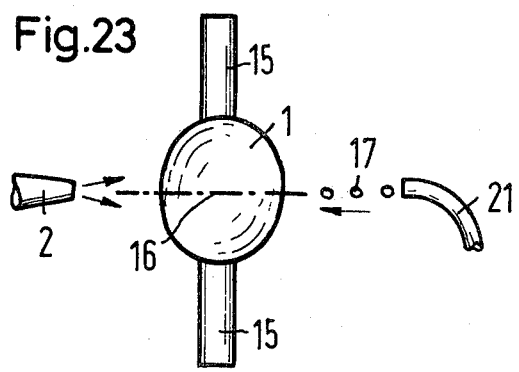
FIG. 23 illustrates compensation for force of the pellets.
Figure 22:
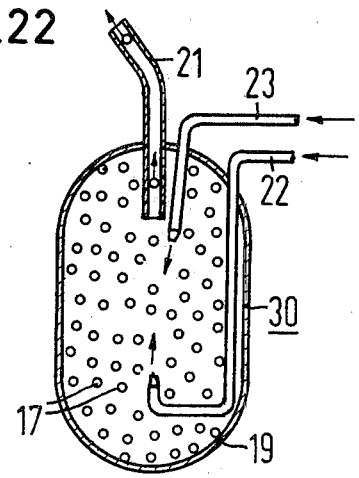
FIG. 22 illustrates a device for forming the pellets seen in FIG. 21.

If it should be come necessary, during the pulling process, to replace the consumed material of the melt, this material may be gradually inserted in the shape of a rod 20, into the melt 1 and, thus, into the vicinity of the devices which heat the melt. This opens up another possibility to attain a relative shift between the crystal 15 being pulled, and the melt 1, said shift being required for the pulling process (FIG. 20). The crystal must be fixed. It is even better if a material which feeds the melt, in form of a beam of small particles 17, is installed with specific speed into the freely suspended melt. FIG. 21 shows a device 18, which makes it possible to install silicon, as a fine powder or preferably in form of equal size small spheres or pellets 17, into the melt. The device 30 according to FIG. 22 used for this purpose, comprises a container 19 that contains a great number of silicon spheres 17 of the same size, for example 2 mm diameter. The container 19 has an outlet tube 21 to the outside, whose inner diameter is only a little larger than the outer diameter of a sphere 17. The container also comprises two inlet tubes (pipes) 22 and 23 for a neutral gas. The gas is supposed to slightly whirl up the spheres. When one sphere approaches the vicinity of the outlet tube, it will preferably be moved to the outside and driven toward the silicon ball or sphere 1. The tube 22 is directed toward the outlet pipe 21. It supports the movement of the spheres 17, toward the outlet tube 21. Tube 23 acts, in reverse. The pulses which are transmitted by the silicon balls 17 can easily be used for compensating the pulling force or for control purposes. On the other hand, during the bilaterial radiation of the silicon sphere 17, their pulses should be compensated for, which can be done by a radiator 2 (which is used anyway for heating or for holding the liquid silicon ball 1). (FIG. 23).

For heating the silicon sphere 1, up to melting, the energy of the sun 24 is utilized and is directed by means of a concave reflector 25, upon the sphere 1 (FIG. 24). The reflector whose area is about 15 m$^2$ is fastened to one end of a carrier 29 of about 10 m long, while at the other end holds a processing system for the suspended silicon ball or sphere 1, whose diameter is, for example 10 cm. The holding and processing system essentially comprises radiators 2, which adjust the position of the sphere 1, or which move the sphere actively processing radiators 2, 21, which give the sphere 1 rotation, additional heat, silicon particles 17 and dopants. The container 26, which supports the radiators 2, 21, also contains the energy and material supply, as well as a programming device.

A photo sensitive control system 27, ensures the correct position of the system, relative the sun. To this end, swivable control and adjusting nozzles 28 are also provided at the corners and are used for the alignment of the entire apparatus. The focal length of the concave reflector 25 is such that the energy is focused upon the sphere 1.

Even better than the just described arrangement which utilizes the radiation energy of the sun, are the devices which use atomic energy. This can be explained by the fact that the transport of energy, i.e. primarily as atomic energy, into cosmic space is not as expensive as the transport of relatively massive and complicated devices, which utilize solar energy.

When the device of the invention is subjected to low accelerations, by either being accelerated translatory or by being rotated, e.g. in a rotating space station or by being placed on a celestial body with low gravitation, then the radiators, whose direction has to contribute toward the compensation of the acceleration, would have to transmit, of necessity, stronger pulses, upon the silicon sphere 1. The silicon sphere 1 is then oblate even without rotation. In principle, it is even possible to install such a device on or within our moon, whose radiators are strong enough, in one direction, to keep a larger silicon sphere 1, afloat. While on earth the suspended or floating spheres 1 made of silicon may have diameters of only a few millimeters (otherwise they will begin to become flat and will start whirling), the spheres which float on the moon will probably be able to have a diameter amounting to several centimers. By contrast, when floating spheres 1 are used in or at artificial satellites serving as reference bodies, their diameters need not be limited in size due to accelerating forces, but because of other factors, such as for example, a too intensive radiation of sphere 1.

It is obvious that the use of the indicated method for producing pure substances is not limited to silicon, but can be used also for germanium, for other semiconductor materials and semiconductor compounds, particularly for $A^{III}B^{V}$ compounds (e.g. for aluminum antimonide), as well as for a large number of other crystallizable substances.

What is claimed is:

1. Means for producing semiconductor crystals particularly silicon crystals by oriented crystallization from a melt which is produced in a suspended state under cosmic vacuum, on a space vehicle comprising six beam emitters affixed to a common holder for producing an oriented holding beam whereby two of said beam emitters are provided for each of three cartesian coordinates of space and each said two of said beam emitters are so oriented relative to each other that the beams which are emitted from the beam emitters which are related to each in pairs, are oriented in opposition to one another in each pair, and the beams emitted by the said six beam emitters all meet in a common point between said beam emitters, means for controlling the intensities of the beams emitted by the six beam emitters that said six beam emitters retain, in a freely suspended state, the melt which is located at the point of intersection of the six beams, and means for heating the melt in such a manner that the heating effect is focused upon the point of intersection of the six beams.

2. Apparatus as claimed in claim 1, wherein said six beam emitters are constructed as electron beam emitters.

3. Apparatus as claimed in claim 1, wherein atomic energy is used as the energy source for radiating energy focused upon said point of intersection for heating the melt.

4. Apparatus as claimed in claim 1, having means for heating the melt, comprising a concave mirror so connected with the common holder of the beam emitters, that the focal point of said concave mirror impinges onto the common point of intersection of the material beams emitted by the six beam emitters.

5. Apparatus as claimed in claim 1, having additional beam emitters provided which are so oriented to melt held in the point of intersection of the holding beam emitted by the six beam emitters, that they effect a rotation of said melt.

6. Apparatus as claimed in claim 1, having photo cell means to indicate a decentralized position of the melt.

7. Apparatus as claimed in claim 1, where for the further supply of a freely suspended silicon melt localized in the common point of intersection of the six holding beams comprises a sealed container filled with silicon spheres having the same dimensions, an outlet tube in said container which gives passage to only one silicon sphere, two inlet tubes in said container for admitting an inert gas into the container, one of said other tubes ending in the container directly in the vicinity of the mouth of the outlet tube, the other of said other tubes also ending in the container but spaced from the vicinity of the mouth of the outlet tube.

* * * * *